(12) United States Patent
Jovanovic et al.

(10) Patent No.: US 10,466,292 B2
(45) Date of Patent: Nov. 5, 2019

(54) METHOD AND SYSTEM FOR THERMAL CONTROL OF DEVICES IN AN ELECTRONICS TESTER

(71) Applicant: Aehr Test Systems, Fremont, CA (US)

(72) Inventors: Jovan Jovanovic, Santa Clara, CA (US); Kenneth W. Deboe, Santa Clara, CA (US); Steven C. Steps, Saratoga, CA (US)

(73) Assignee: Aehr Test Systems, Fremont, CA (US)

( * ) Notice: Subject to any disclaimer, the term of this patent is extended or adjusted under 35 U.S.C. 154(b) by 0 days.

(21) Appl. No.: 15/400,771

(22) Filed: Jan. 6, 2017

(65) Prior Publication Data

US 2017/0200660 A1 Jul. 13, 2017

Related U.S. Application Data

(60) Provisional application No. 62/276,746, filed on Jan. 8, 2016.

(51) Int. Cl.

| | |
|---|---|
| *H01L 21/66* | (2006.01) |
| *G01R 31/00* | (2006.01) |
| *G01R 31/28* | (2006.01) |
| *H01L 21/67* | (2006.01) |
| *H01L 21/324* | (2006.01) |
| *H01L 21/687* | (2006.01) |
| *G01R 1/04* | (2006.01) |

(52) U.S. Cl.
CPC ....... *G01R 31/003* (2013.01); *G01R 31/2831* (2013.01); *G01R 31/2875* (2013.01); *H01L 21/324* (2013.01); *H01L 21/67103* (2013.01); *H01L 21/67109* (2013.01); *H01L 21/67248* (2013.01); *H01L 21/68785* (2013.01); *H01L 22/26* (2013.01); *G01R 1/0491* (2013.01)

(58) Field of Classification Search
CPC ... H01L 22/26; H01L 21/67; H01L 21/67109; H01L 21/67242; H01L 21/67248; H01L 21/324; H01L 21/68785; H01L 21/67103; G01R 31/28; G01R 31/2817; G01R 31/2831; G01R 31/2849; G01R 31/2855; G01R 31/2862; G01R 31/2863; G01R 31/003
See application file for complete search history.

(56) References Cited

U.S. PATENT DOCUMENTS

| | | |
|---|---|---|
| 5,945,834 A | 8/1999 | Nakata et al. |
| 6,091,060 A | 7/2000 | Getchel et al. |

(Continued)

OTHER PUBLICATIONS

International Search Report and Written Opinion dated Mar. 30, 2017, International PCT Application No. PCT/US2017/012597 with International Filing Date of Jan. 6, 2017, (11 pages).

*Primary Examiner* — Son T Le
(74) *Attorney, Agent, or Firm* — Stephen M. De Klerk

(57) ABSTRACT

A tester apparatus is provided. Slot assemblies are removably mounted to a frame. Each slot assembly allows for individual heating and temperature control of a respective cartridge that is inserted into the slot assembly. A closed loop air path is defined by the frame and a heater and cooler are located in the closed loop air path to cool or heat the cartridge with air. Individual cartridges can be inserted or be removed while other cartridges are in various stages of being tested or in various stages of temperature ramps.

19 Claims, 7 Drawing Sheets

(56) References Cited

U.S. PATENT DOCUMENTS

| | | | |
|---|---|---|---|
| 6,124,725 A * | 9/2000 | Sato | G01R 31/2851 |
| | | | 324/754.03 |
| 6,268,740 B1 | 7/2001 | Iida | |
| 2002/0030502 A1* | 3/2002 | Uher | G01R 1/0491 |
| | | | 324/750.05 |
| 2002/0048826 A1* | 4/2002 | Richmond, II | G01R 31/2868 |
| | | | 438/14 |
| 2004/0217772 A1 | 11/2004 | Kline | |
| 2007/0028834 A1* | 2/2007 | Awazu | G01R 31/2886 |
| | | | 117/100 |
| 2009/0015282 A1* | 1/2009 | Steps | G01R 1/0491 |
| | | | 324/750.01 |
| 2011/0298630 A1 | 12/2011 | Kiyokawa et al. | |

* cited by examiner

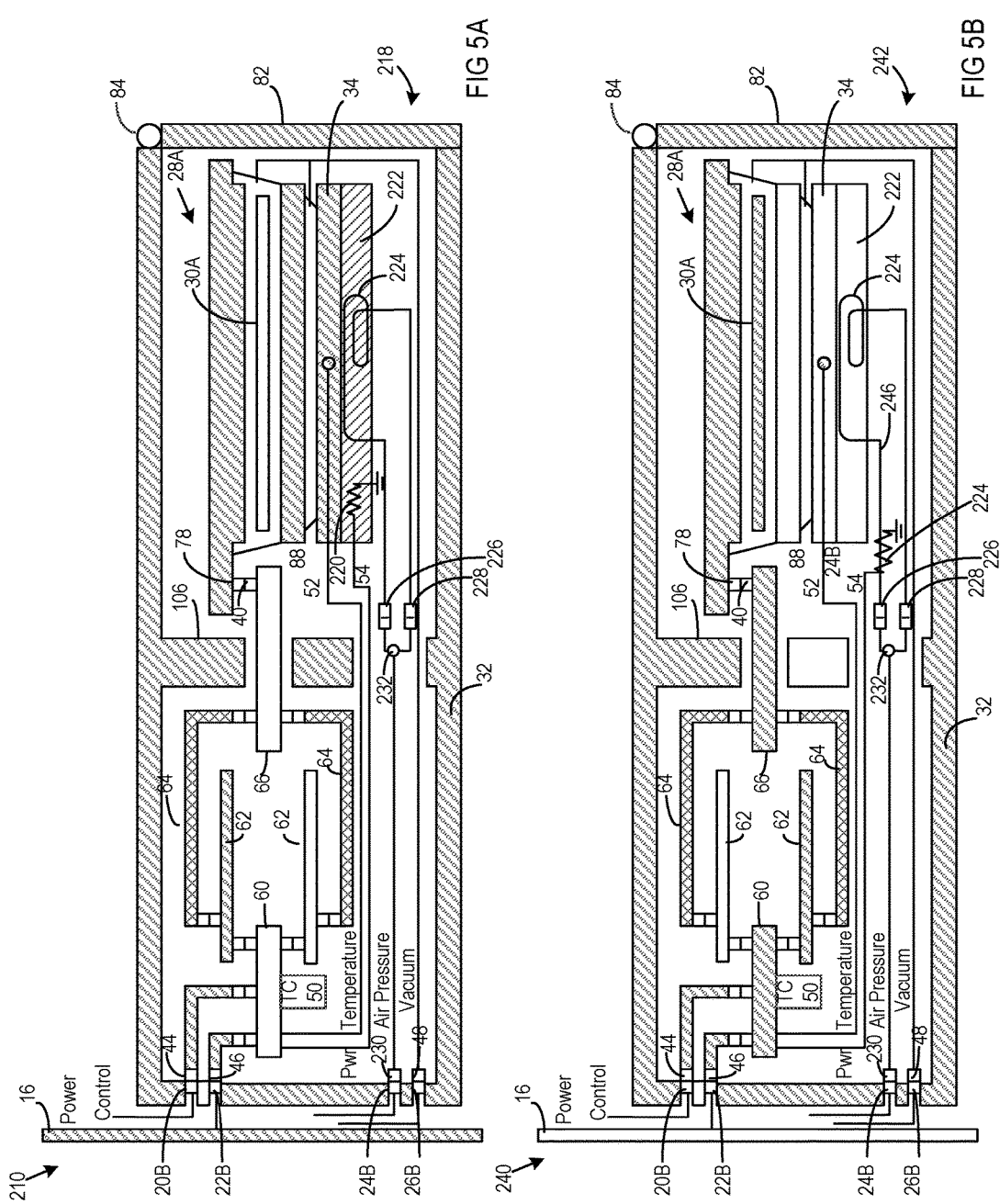

FIG 5C

METHOD AND SYSTEM FOR THERMAL CONTROL OF DEVICES IN AN ELECTRONICS TESTER

CROSS-REFERENCE TO RELATED APPLICATIONS

This application claims priority from U.S. Provisional Patent Application No. 62/276,746, filed on Jan. 8, 2016, all of which is incorporated herein by reference in its entirety.

BACKGROUND OF THE INVENTION

1). Field of the Invention

This invention relates to a tester apparatus that is used for testing microelectronic circuits.

2). Discussion of Related Art

Microelectronic circuits are usually fabricated in and on semiconductor wafers. Such a wafer is subsequently "singulated" or "diced" into individual dies. Such a die is typically mounted to a supporting substrate for purposes of providing rigidity thereto and for electronic communication with an integrated or microelectronic circuit of the die. Final packaging may include encapsulation of the die and the resulting package can then be shipped to a customer.

It is required that the die or the package be tested before being shipped to the customer. Ideally, the die should be tested at an early stage for purposes of identifying defects that occur during early stage manufacture. Wafer level testing may be accomplished by providing a handler and a contactor with contacts and then using the handler to move the wafer so that contacts on the wafer make contact with the contacts on the contactor. Power and electronic signals can then be provided through the contactor to and from microelectronic circuits formed in the wafer.

According to various embodiments a wafer includes a substrate such as a silicon substrate or a printed circuit board and one or more devices fabricated in the substrate or mounted to the substrate.

Alternatively, the wafer can be located within a portable cartridge having an electric interface and a thermal chuck. Power and signals can be provided through the electric interface to and from the wafer while a temperature of the wafer is thermally controlled by heating or cooling the thermal chuck.

SUMMARY OF THE INVENTION

The invention provides a tester apparatus including a frame, a plurality of slot assemblies, each slot assembly including a slot assembly body mounted to the frame, a holder mounted to the slot assembly body and forming a testing station for placement of a respective wafer, the respective wafer having at least one microelectronic device, a plurality of electrical conductors and a temperature detector in proximity to the respective wafer to detect a temperature of the respective wafer, at least one temperature modification device, which, when operated causes a transfer of heat to or from the wafers, at least one thermal controller that controls the transfer of heat based on the temperatures of the wafers detected by the temperature detectors, a power supply connected through the electrical conductors to the wafers in the testing stations and providing at least power to each microelectronic device and a tester connected through the electrical conductors to the wafers and measuring a performance of the microelectronic device.

The invention further provides a method of testing microelectronic devices including placing a respective wafer of a plurality of wafers, each having at least one microelectronic device, in a respective testing station provided by a respective holder of a respective slot assembly mounted to a frame, detecting a respective temperature of the respective wafer with a respective temperature detector in proximity to the respective wafer, transferring of heat to or from the wafers, controlling the transfer of heat based on the temperatures of the wafers detected by the temperature detectors and testing the microelectronic devices by providing at least power to each microelectronic device and measuring a performance of the microelectronic device.

The invention also provides a tester apparatus including a frame defining at least a first closed loop air path, at least a first fan located in the first closed loop air path to recirculate air through the first closed loop air path, a plurality of slot assemblies, each slot assembly including a slot assembly body mounted to the frame, a holder mounted to the slot assembly body and forming a testing station for placement of a respective wafer, the respective wafer having at least one microelectronic device and being held in the first closed loop air path and a plurality of electrical conductors, a temperature modification device mounted to the frame in the first closed loop air path, which, when operated causes a transfer of heat between the air in the first closed loop air path and the temperature modification device in the first closed loop air path, at least one temperature detector detecting a temperature, a thermal controller that controls the transfer of heat based on the temperature, a power supply connected through the electrical conductors to the wafers in the testing stations and providing at least power to each microelectronic device and a tester connected through the electrical conductors to the wafers and measuring a performance of the microelectronic device.

The invention further provides a method of testing microelectronic devices including placing a respective wafer of a plurality of wafers, each having at least one microelectronic device, in a respective testing station provided by a respective holder of a respective slot assembly mounted to a frame, the wafers being held in a first closed loop air path defined by the frame, operating at least a first fan located in the first closed loop air path to recirculate air through the first closed loop air path, transferring heat between at least one temperature modification device mounted to the frame in the first closed loop air path and the air in the first closed loop air path, detecting a temperature, controlling the transfer of heat based on the temperature and testing the microelectronic devices by providing at least power to each microelectronic device and measuring a performance of the microelectronic device.

The invention also provides a tester apparatus including a frame, a plurality of slot assemblies, each slot assembly including a slot assembly body mounted to the frame, a holder mounted to the slot assembly body and forming a testing station for placement of a respective wafer, the respective wafer having at least one microelectronic device, a plurality of electrical conductors and a temperature detector in proximity to the respective wafer to detect a temperature of the respective wafer, at least one temperature modification device, which, when operated causes a transfer of heat to or from the wafers and a tester connected through the electrical conductors to the wafers in the testing stations to test the microelectronic devices by providing at least power to each microelectronic device and measuring a performance of the microelectronic device, wherein at least one of the conductors of a first of the slot assemblies is connectable between a first of the wafers and the power while transferring heat to or from a second of the wafers that is connected to the power.

The invention further provides a method of testing microelectronic devices including placing a respective wafer of a plurality of wafers, each having at least one microelectronic device, in a respective testing station provided by a respective holder of a respective slot assembly mounted to a frame, detecting a respective temperature of the respective wafer with a respective a temperature detector in proximity to the respective wafer, transferring of heat to or from the wafers, testing the microelectronic devices by providing at least power to each microelectronic device and measuring a performance of the microelectronic device and connecting at least one of the conductors of a first of the slot assemblies between a first of the wafers and the power while transferring heat to or from a second of the wafers that is connected to the power.

BRIEF DESCRIPTION OF THE DRAWINGS

The invention is further described by way of examples with reference to the accompanying drawings, wherein:

FIG. 5A is a cross-sectional side view of a tester apparatus having a slot assembly according to another embodiment of the invention;

FIGS. 5B and 5C are cross-sectional side views of a tester apparatus having a slot assembly according to a further embodiment of the invention;

DETAILED DESCRIPTION OF THE INVENTION

Figure 1:
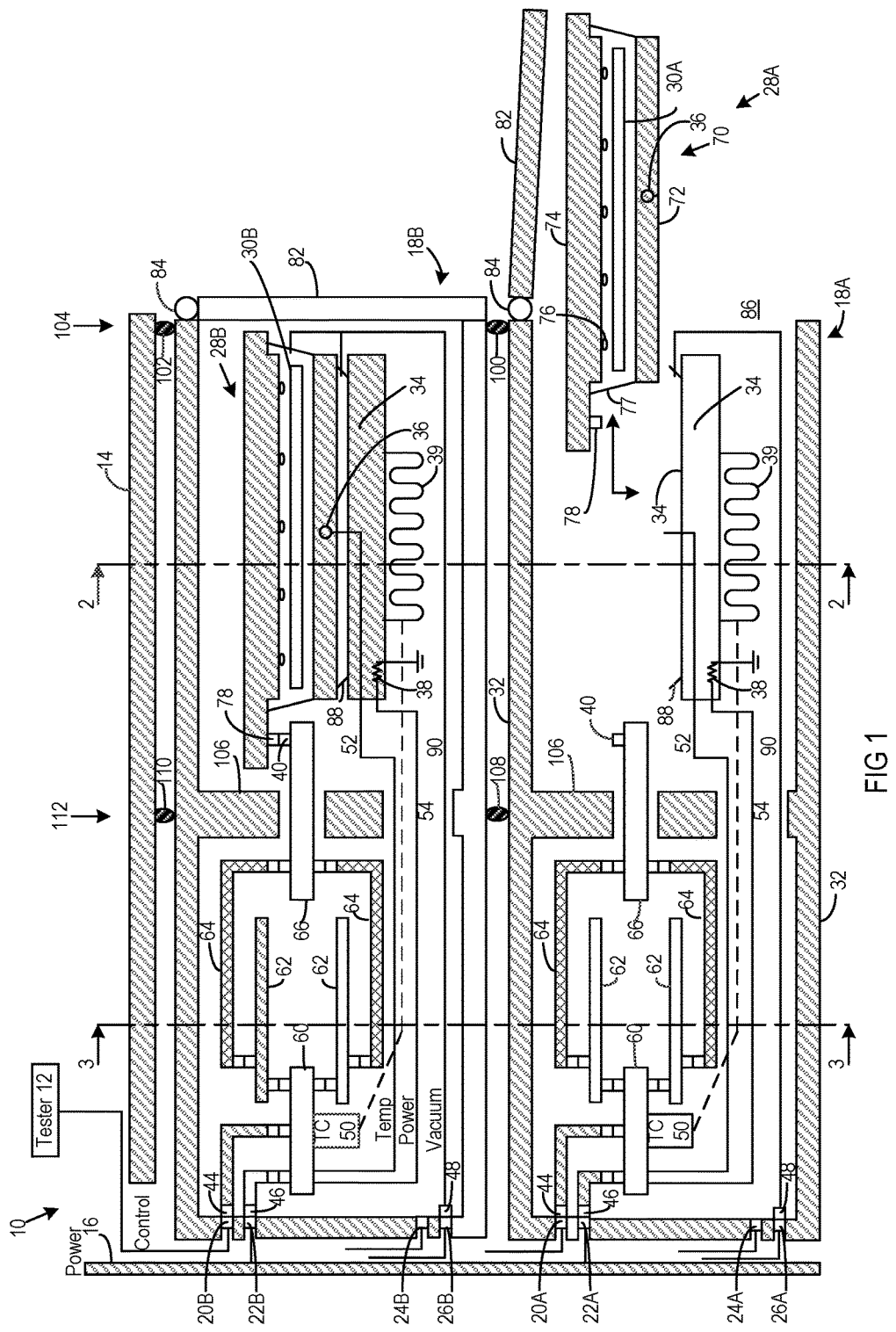
FIG. 1 is a cross-sectional side view of a tester apparatus having slot assemblies according to one embodiment of the invention.

FIG. 1 of the accompanying drawings illustrates a tester apparatus 10, according to an embodiment of the invention, that includes a tester 12, a frame 14, a power bus 16, first and second slot assemblies 18A and 18B, first and second tester interfaces 20A and 20B, first and second power interfaces 22A and 22B, first and second pressurized air interfaces 24A and 24B, first and second vacuum interfaces 26A and 26B, first and second cartridges 28A and 28B, and first and second wafers 30A and 30B.

The slot assembly 18A includes a slot assembly body 32, a thermal chuck 34, a temperature detector 36, a temperature modification device in the form of a heating element 38, a cooling element 39, a first slot assembly interface 40, and a plurality of second slot assembly interfaces, including a control interface 44, a power interface 46 and a vacuum interface 48.

The first slot assembly interface 40 is located within the slot assembly body 32 and is mounted to the slot assembly body 32. The second interfaces in the form of the control interface 44, the power interface 46 and the vacuum interface 48 are mounted in a left wall of the slot assembly body 32 mounted to the frame 14.

The slot assembly 18A is insertable into and is removable from the frame 14. When the slot assembly 18A is inserted into the frame 14, the tester interface 20A, the power interface 22A and the first vacuum interface 26A connect to the control interface 44, the power interface 46 and the vacuum interface 48 respectively. When the slot assembly 18A is removed from the frame 14, the tester interface 20A, power interface 22A and first vacuum interface 26A disconnect from the control interface 44, power interface 46 and vacuum interface 48.

The slot assembly 18A includes a motherboard 60 having test electronics, a plurality of channel module boards 62 having test electronics, flexible connectors 64, and a connection board 66. The control interface 44 and the power interface 46 are connected to the motherboard 60 and a thermal controller 50 is mounted to the motherboard 60. The channel module boards 62 are electrically connected to the motherboard 60. The flexible connectors 64 connect the channel module boards 62 to the connection board 66. Control functionality is provided through electrical conductors connecting the control interface 44 to the motherboard 60. Power is provided through the power interface 46 to the motherboard 60. Both power and control are provided from the motherboard 60 through conductors to the channel module boards 62. The flexible connectors 64 provide conductors that connect the channel module boards 62 to the connection board 66. The connection board 66 includes a conductor that connects the flexible connectors 64 to the first slot assembly interface 40. This first slot assembly interface 40 is thus connected through various conductors to the control interface 44 and power interface 46 so that power and control can be provided via the control interface 44 and power interface 46 to the first slot assembly interface 40.

The second slot assembly 18B includes similar components to the first slot assembly 18A and like reference numerals indicate like components. The second slot assembly 18B is inserted into the frame 14 so that the control interface 44, power interface 46 and vacuum interface 48 of the second slot assembly 18B are connected to the tester interface 20B, power interface 22B and second vacuum interface 26B, respectively.

The cartridge 28A includes a cartridge body 70 formed by a thin chuck 72 and a backing board 74. A temperature detector 36 is located in the thin chuck 72. The wafer 30A has a plurality of microelectronic devices formed therein. The wafer 30A is inserted into the cartridge body 70 between the thin chuck 72 and backing board 74. Cartridge contacts 76 make contact with respective contacts (not shown) on the wafer 30A. The cartridge 28A further includes a cartridge interface 78 on the backing board 74. Conductors in the backing board 74 connect the cartridge interface 78 to the cartridge contacts 76.

The cartridge 28A has a seal 77 connected between the backing board 74 and the thin chuck 72. A vacuum is applied to an area defined by the seal 77, backing board 74 and the thin chuck 72. The vacuum keeps the cartridge 28A together and ensures proper contact between the cartridge contacts 76 and the contacts on the wafer 30A. The temperature detector 36 is in proximity to the wafer 30A and therefore close enough to the wafer 30A to detect a temperature of the wafer 30A or within five degrees Celsius, preferably within one of two degrees Celsius of the wafer 30A.

The slot assembly 18A further has a door 82 connected to the slot assembly body 32 by a hinge 84. When the door 82 is rotated into an open position, the cartridge 28A can be inserted through a door opening 86 into the slot assembly body 32. The cartridge 28A is then lowered onto the thermal chuck 34 and the door 82 is closed. The slot assembly 18A further has a seal 88 that is located between the thermal chuck 34 and the thin chuck 72. A vacuum is applied through the vacuum interface 48 and a vacuum line 90 to an area defined by the seal 88, thermal chuck 34 and thin chuck 72. The thermal chuck 34 then essentially forms a holder having a testing station for a wafer. The thermal chuck 34 is mounted to the slot assembly body 32. A good thermal connection is thereby provided between the thermal chuck 34 and the thin chuck 72. When heat is created by the heating element 38, the heat conducts through the thermal chuck 34 and the thin chuck 72 to reach the wafer 30A.

The cartridge interface 78 engages with the first slot assembly interface 40. Power and signals are provided via the first slot assembly interface 40, cartridge interface 78 and cartridge contacts 76 to the wafer 30A. A performance of devices within the wafer 30A is measured through the cartridge contacts 76, cartridge interface 78 and first slot assembly interface 40.

The door 82 of the slot assembly 18B is shown in a closed position. A front seal 100 is mounted on an upper surface of the slot assembly 18A and seals with a lower surface of the slot assembly 18B. A front seal 102 is mounted to an upper surface of the slot assembly 18B and seals with a lower surface of the frame 14. A continuous sealed front wall 104 is provided by the doors 82 of the slot assemblies 18A and 18B and the front seals 100 and 102.

The slot assembly 18A further includes a thermal controller 50. The temperature detector 36 is connected through a temperature feedback line 52 to the thermal controller 50. Power is provided through the power interface 46 and a power line 54 to the heating element 38 so that the heating element 38 heats up. The heating element 38 then heats the thermal chuck 34 and the wafer 30A on the thermal chuck 34. The cooling element 39 is located against the heating element 38 and may for example be a cooling element body with a liquid flowing therethrough at a controllable rate to control the amount of heat that is transferred away from the wafer and the thermal chuck 34. The heating element 38 and cooling element 39 are controlled by the thermal controller 50 based on the temperature detected by the temperature detector 36.

The slot assembly 18A includes a separator seal 108 mounted to an upper surface of the slot assembly body 32 above the internal wall 106 thereof. The separator seal 108 seals with a lower surface of the slot assembly 18B. The slot assembly 18B has a separator seal 110 mounted to an upper surface of the slot assembly body 32 thereof. The separator seal 108 seals with a lower surface of the frame 14. A continuous sealed separator wall 112 is provided by the internal walls 106 of the slot assemblies 18A and 18B and the separator seals 108 and 110.

Figure 2:
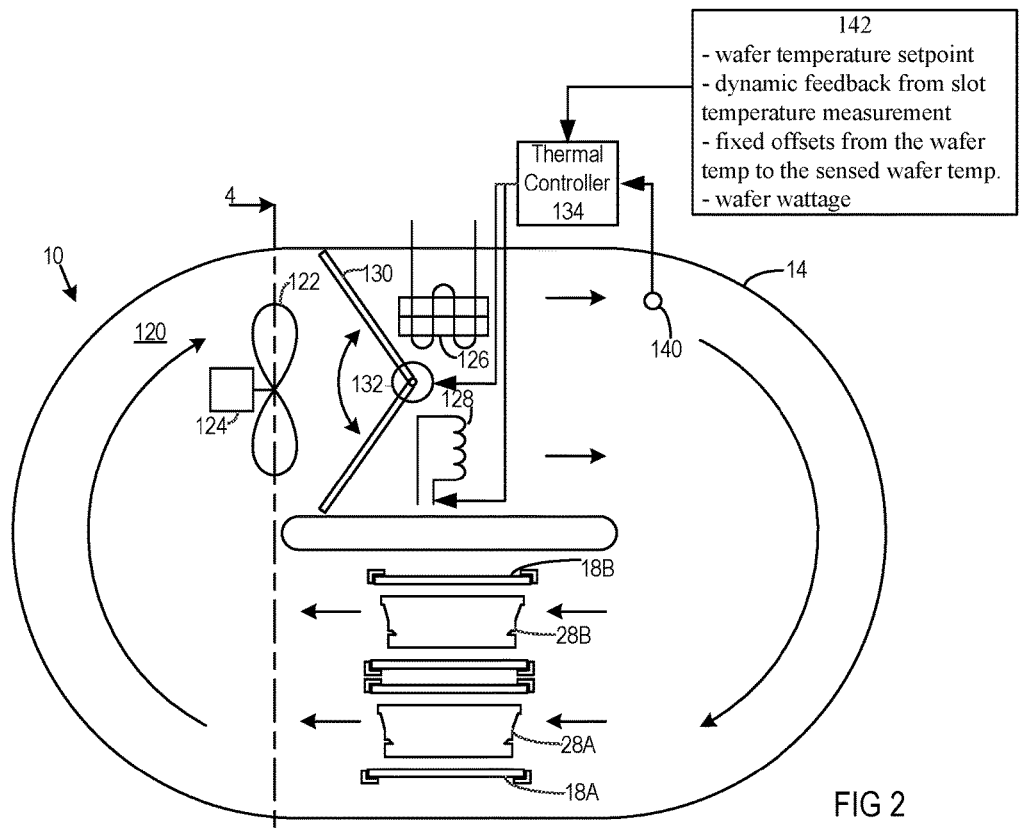
FIG. 2 is a cross-sectional side view of the tester apparatus on 2-2 in FIG. 1.

FIG. 2 illustrates the tester apparatus 10 on 2-2 in FIG. 1. The frame 14 defines a first closed loop air path 120. Air inlet and outlet openings (not shown) can be opened to change the first closed loop air path 120 into an open air path wherein air at room temperature passes through the frame 14 without being recirculated. A closed loop path is particularly useful in a clean room environment because it results in less particulate material being released into the air.

The tester apparatus 10 further includes a first fan 122, a first fan motor 124, a temperature modification device in the form of a water cooler 126, a temperature modification device in the form of an electric heater 128, a damper 130, a damper actuator 132 and a thermal controller 134.

The first fan 122 and first fan motor 124 are mounted in an upper portion of the first closed loop air path 120. The damper 130 is mounted to the frame 14 for pivotal movement between an up position and a down position. The water cooler 126 and electric heater 128 are mounted to the frame 14 within an upper portion of the first closed loop air path 120.

The damper actuator 132 is connected to the damper 130 to rotate the damper between the up position and the down position. The thermal controller 134 controls operation of the damper actuator 132 and current provided to the electric heater 128. The thermal controller 134 receives an input from an air temperature measurement device 140 located within the first closed loop air path 120. As represented by block 142 an air temperature set point that is set by the thermal controller 134 is a function of all of the following:
1) wafer temperature set point (programmed by the user);
2) dynamic feedback from slot temperature measurement by the temperature detectors 36 in FIG. 1;
3) fixed offsets from the wafer temperature to the sensed wafer temp, which are primarily calibratable thermocouple variations and temperature drops that can be a function of the wafer wattage; and
4) wafer wattage.

The cartridges 28A and 28B are positioned with the slot assemblies 18A and 18B and are within a lower half of the first closed loop air path 120.

In use, current is provided to the first fan motor 124. The first fan motor 124 rotates the first fan 122. The first fan 122 recirculates air in a clockwise direction through the first closed loop air path 120.

The thermal controller 134 receives the temperature from the temperature measurement device 140. The thermal controller 134 is set to maintain the temperature of the air in the first closed loop air path 120 at a predetermined setting. If the air has to be heated, the thermal controller 134 activates the damper actuator 132 to rotate the damper 130 into the up position. Air is deflected away from the water cooler 126 towards the electric heater 128. The electric heater 128 then heats the air.

If the air within the first closed loop air path 120 has to be cooled, the thermal controller 134 reduces a current on the electric heater 128 and operates the damper actuator 132 to rotate the damper 130 into the down position. In the down position, the damper 130 deflects air away from the electric heater 128 so that the majority of the air flows over a heat exchanger of the water cooler 126. The water cooler 126 then cools the air. The air then flows through the slot assemblies 18A and 18B over the cartridges 28A or 28B. The cartridges 28A or 28B are then heated or cooled by the air through convection.

Figure 3:
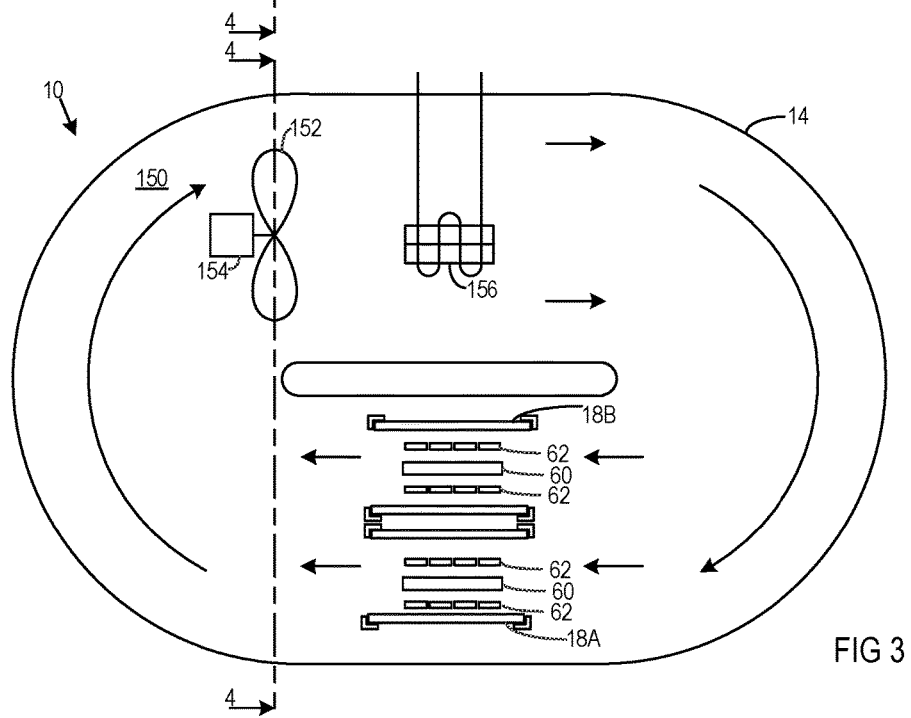
FIG. 3 is a cross-sectional side view of the tester apparatus on 3-3 in FIG. 1.

FIG. 3 shows the tester apparatus 10 on 3-3 in FIG. 1. The frame 14 defines a second closed loop air path 150. The tester apparatus 10 further includes a second fan 152, a second fan motor 154 and a temperature modification device in the form of a water cooler 156. No electric heater or damper is provided as in FIG. 2. Air inlet and outlet openings (not shown) can be opened to change the first closed loop air path 150 into an open air path wherein air at room temperature passes through the frame 14 without being recirculated.

A closed loop path is particularly useful in a clean room environment because it results in less particulate material being released into the air. The second fan 152 and second fan motor 154 are located in an upper portion of the second closed loop air path 150. The water cooler 156 is located slightly downstream from the second fan 152 within the second closed loop air path 150. The motherboard 60 and channel module boards 62 that form a part of the slot assemblies 18A and 18B are located within a lower half of the second closed loop air path 150.

In use, electric current is provided to the second fan motor 154, which rotates the second fan 152. The second fan 152 then recirculates air in a clockwise direction through the second closed loop air path 150. The air is cooled by the water cooler 156. The cooled air then passes over the motherboard 60 and channel module boards 62 so that heat transfers from the motherboard 60 and channel module boards 62 to the air through convection.

Air recirculating through the first closed loop air path 120 in FIG. 1 is kept separate from air in the second closed loop air path 150 in FIG. 3 by the continuous sealed separator wall 112 shown in FIG. 1. The continuous sealed front wall 104 shown in FIG. 1 prevents air from escaping out of the first closed loop air path 120.

Figure 4:
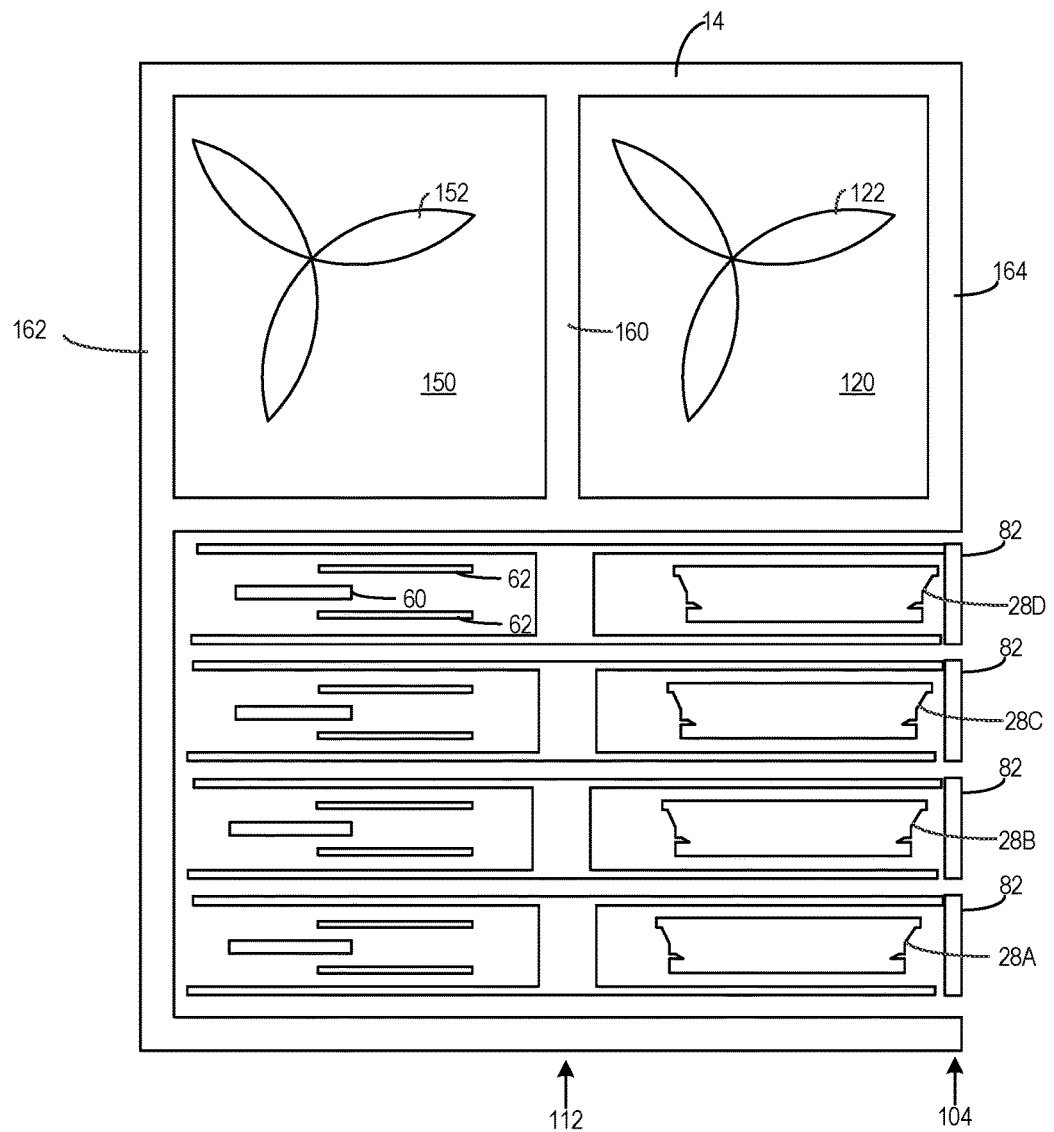
FIG. 4 is a cross-sectional side view of the tester apparatus on 4-4 in FIGS. 2 and 3.

As shown in FIG. 4, a plenum 160 separates the first closed loop air path 120 from the second closed loop air path 150 in all areas except those provided by the continuous sealed separator wall 112. The frame 14 has left and right walls 162 and 164 that further define the closed loop air paths 120 and 150.

FIG. 5A illustrates a tester apparatus 210 having a slot assembly 218 according to an alternate embodiment of the invention. The slot assembly 218 includes a heating resistor 220 that operates in a similar manner to the heating element 38 shown in FIG. 1. The heating resistor 220 is located within a thermal chuck 222. The thermal chuck 222 has a thermal fluid passage 224 formed therein. The thermal fluid passage 224 holds a thermal fluid. The thermal fluid is preferably a liquid as opposed to a gas because liquid is not compressible and heat convects faster to or from a liquid. Different thermal fluids are used for different applications with oil being used for applications where temperatures are the highest.

Opposing ends of the thermal fluid passage 224 are connected to first and second cylinders 226 and 228. The slot assembly 218 includes an air pressure interface 230 and a pneumatic switch 232. The air pressure interface 230 connects to the pressurized air interface 24A on the frame 14 of the tester apparatus 10.

Air pressure at above ambient pressure is provided through the pneumatic switch 232 to either the first cylinder 226 or the second cylinder 228. When the pressurized air is provided to the first cylinder 226, the first cylinder 226 acts as a thermal fluid actuator that pushes the thermal fluid in one direction through the thermal fluid passage 224. The second cylinder 228 then receives the thermal fluid. When air pressure is provided through the pneumatic switch 232 to the second cylinder 228, the second cylinder 228 pushes the thermal fluid in opposite direction through the thermal fluid passage 224 and the first cylinder 226 receives the thermal fluid. The pneumatic switch 232 continually alternates its position so that thermal fluid continually alternates its direction of movement through the thermal fluid passage 224. The heating resistor 220 serves as a heater that is mounted in a position to heat the thermal chuck 222, which heats the thermal fluid. By recirculating the thermal fluid through the thermal fluid passage 224, a more uniform distribution of heat is provided by the thermal chuck 222 to the thermal chuck 34 and ultimately to the wafer 30A.

FIG. 5B illustrates a tester apparatus 240 having a slot assembly 242 according to a further embodiment of the invention. The slot assembly 242 has a thermal fluid passage 224, cylinders 226 and 228, a pneumatic switch 232 and an air pressure interface 230 as in the embodiment of FIG. 5A. The heating resistor 220 in the embodiment of FIG. 5A is replaced with a heating resistor 244 located outside the thermal chuck 222 close to or around a line 246 connecting the first cylinder 226 to the thermal fluid passage 224. The heating resistor 244 is used to continuously heat the thermal fluid within the line 246. A more direct heating of the thermal fluid is provided in the embodiment of FIG. 5B than in the embodiment of FIG. 5A.

Figure 5C:
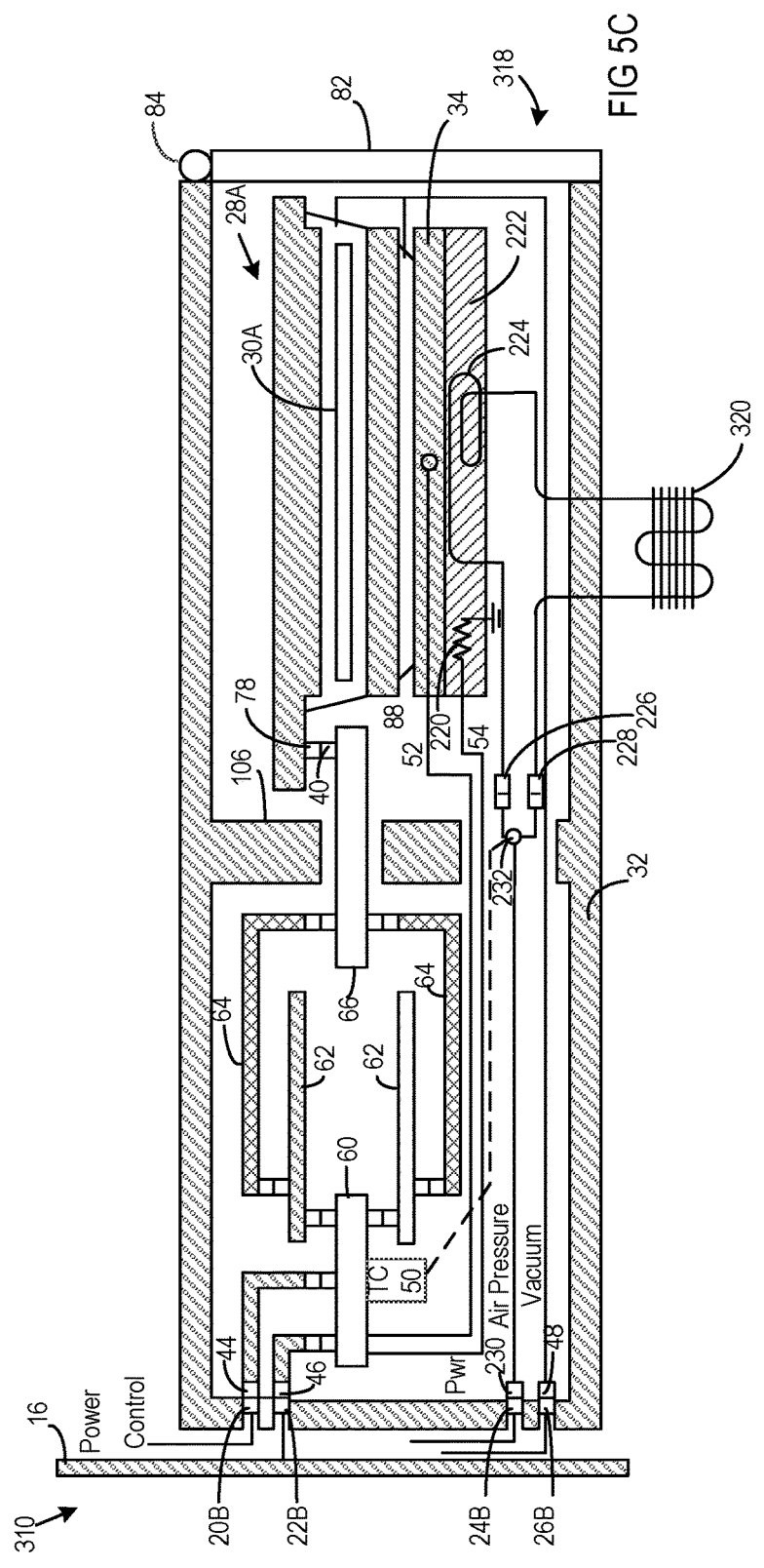

FIG. 5C illustrates a tester apparatus 340 with a slot assembly 318 that is similar to the slot assembly 218 of FIG. 5A except for the inclusion of a cooling element 320. The cooling element is in-line with the thermal fluid passage 224. In use, heat transfers to thermal fluid in the thermal fluid passage 224. The heated thermal fluid then flows to the cooling element 320. The cooling element is located in the first closed loop air path 120 in FIG. 2 so that the heat conducts through the cooling element 320 and then convects to the air in the first closed loop air path 120. The cooled thermal fluid then flows through the first and second cylinders 226 and 228 to the thermal fluid passage 224.

Figure 6A:
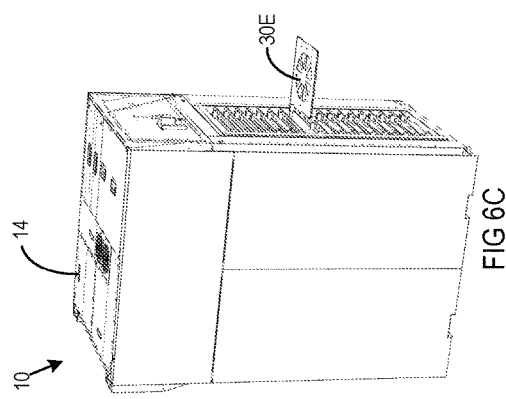
FIGS. 6A, 6B and 6C are perspective views of the tester apparatus illustrating insertion or removal of portable cartridges into or out of an oven defined by a frame.
Figure 6B:
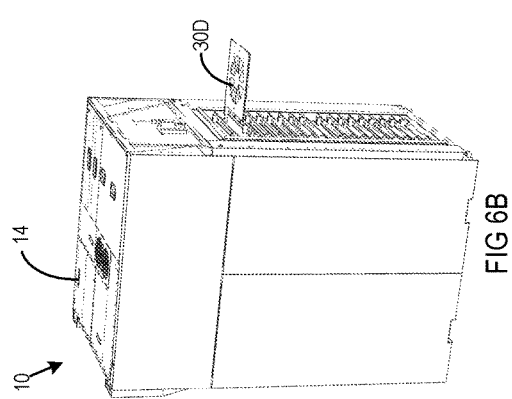
Figure 6C:
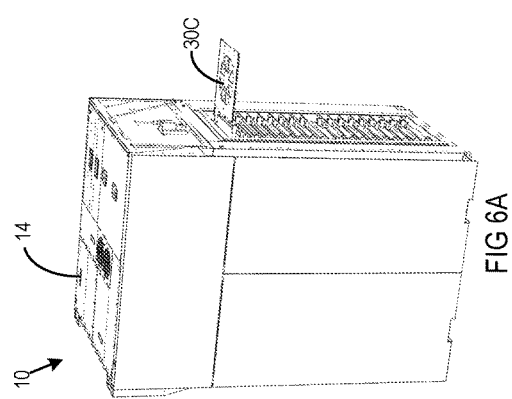
Figure 7:
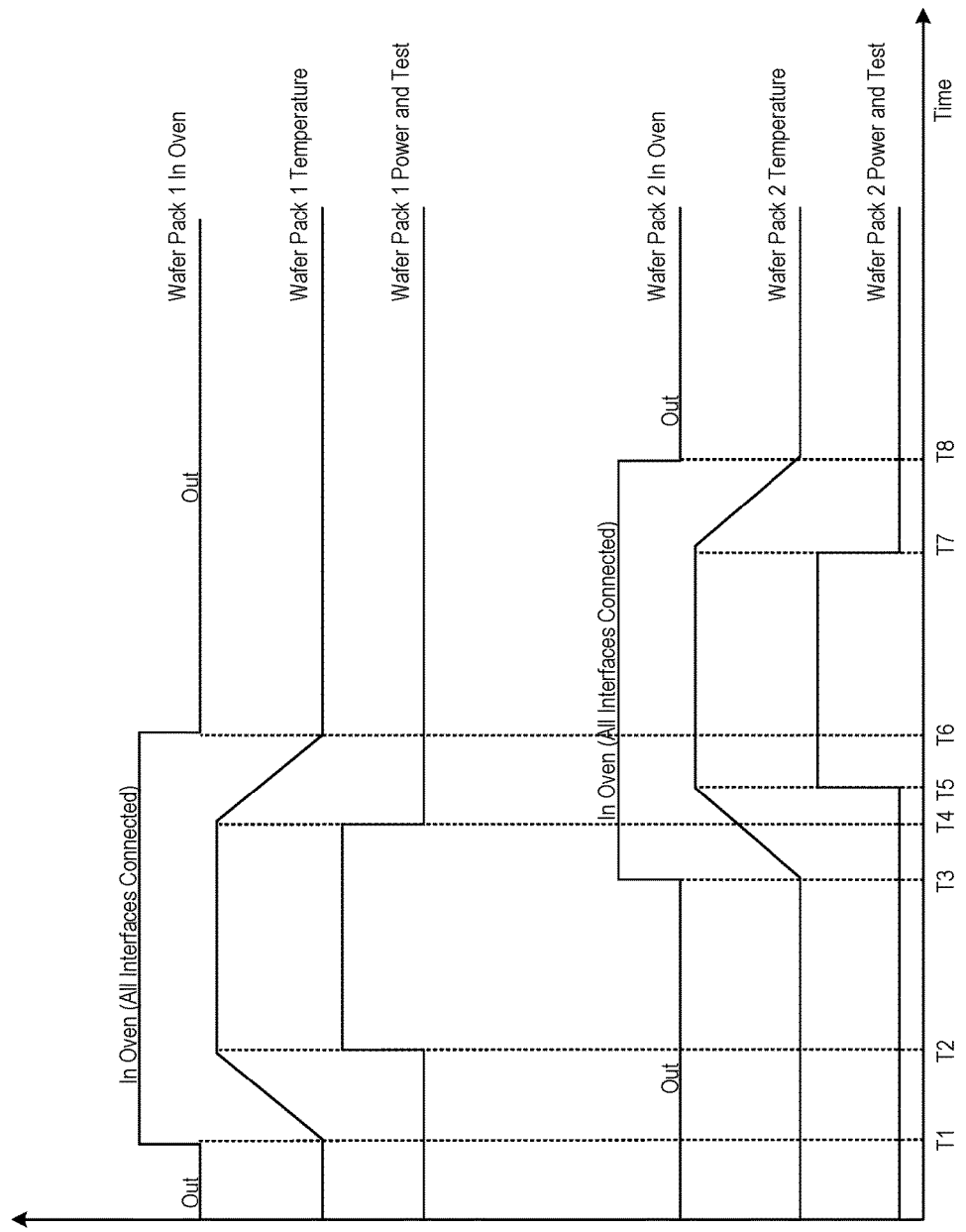
FIG. 7 is a time chart showing how one cartridge can be inserted and used for testing electronic devices of wafers and subsequent insertion of another cartridge.

FIGS. 6A, 6B and 6C illustrate how cartridges 30C, 30D and 30E can be inserted or be removed at any time while all other cartridges are being used to test devices of wafers and may be in various states of temperature ramps. FIG. 7 illustrates the concept in more detail. At time T1 a first cartridge is inserted into the frame 14 while a second cartridge is outside the frame 14. At T1 heating of the first cartridge is initiated. Between T1 and T2 the temperature of the first cartridge increases from room temperature, i.e. about 22° C., to a testing temperature that is 50° C. to 150° C. higher than room temperature at T2. At T2 power is applied to the first cartridge and the devices in the first cartridge are tested. At T3, a second cartridge is inserted into the frame 14 and heating of the second cartridge is initiated. At T4, testing of the first cartridge is terminated. At T4, cooling of the first cartridge is also initiated. At T5, the second cartridge reaches testing temperature and power is provided to the second cartridge and the wafer in the second cartridge is tested. At T6, the second cartridge reaches a temperature close to room temperature and is removed from the frame 14. A third cartridge can then be inserted in place of the first cartridge. At T7, testing of the second cartridge is terminated and cooling thereof is initiated. At T8, the second cartridge has cooled down to room temperature or close to room temperature and is removed from the frame 14.

Different tests can be conducted at different temperatures. By way of example, a cartridge may be inserted and a test be run at room temperature. Another test can be conducted during an upward ramp in temperature. A further test can be conducted at an elevated temperature. A further test can be conducted during a downward ramp in temperature. Two of these tests can be a single test that runs from one temperature stage to the next.

Figure 8:
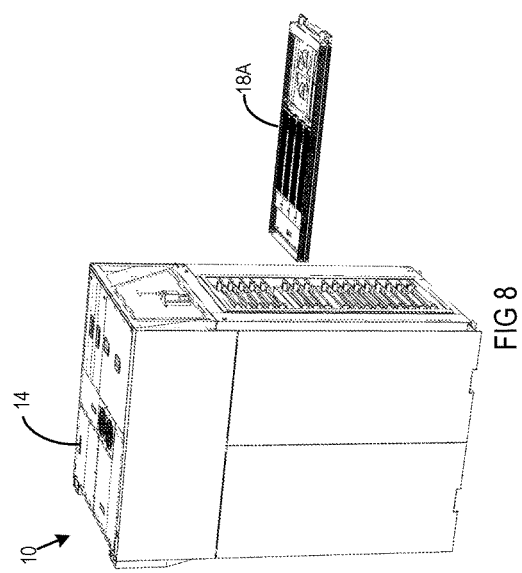
FIG. 8 is a perspective view of the tester apparatus illustrating insertion or removal of one slot assembly.

As shown in FIG. 8, one slot assembly 18A can be removed or be inserted into the frame 14. The slot assembly 18A can be inserted or be removed while the other slot assemblies within the frame 14 are used for testing devices of wafers as described with reference to FIG. 7.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A tester apparatus comprising:
   a plurality of cartridges, each cartridge including:
      a cartridge body for holding a respective wafer;
      a plurality of cartridge contacts held by the cartridge body for making contact with contacts on the wafer; and
      a cartridge interface connected to the cartridge contacts;
   a frame;
   a plurality of slot assemblies, each slot assembly including:
      a slot assembly body mounted to the frame;
      a thermal chuck mounted to the slot assembly body;
      a respective first slot assembly interface mounted to the slot assembly body, each cartridge being insertable with a respective wafer into a respective slot assembly body with a respective cartridge body contacting the respective thermal chuck and a respective cartridge interface connecting with the respective first slot assembly interface; and
      at least one temperature modification device held by the thermal chuck, which, when operated causes a transfer of heat through a respective cartridge body between the respective thermal chuck and a respective wafer; and
      a respective thermal controller that controls the transfer of heat based on the temperature of the wafer placed in the testing station of the respective slot assembly
   a plurality of electrical conductors;
   a plurality of temperature detectors, each temperature detector mounted in proximity to a respective wafer to detect a temperature indicative of a temperature of the respective wafer;
   at least one thermal controller that controls the transfer of heat by the temperature modification device based on the temperatures detected by the temperature detectors;
   a power supply connected through the electrical conductors to the wafers in the testing stations and providing at least power to each microelectronic device; and
   a tester connected through the electrical conductors to the wafers.

2. The tester apparatus of claim 1, wherein the temperature modification device is a heating element.

3. The tester apparatus of claim 1, wherein the temperature modification device includes:
   a thermal fluid passage in the thermal chuck through which thermal fluid is movable.

4. The tester apparatus of claim 3, further comprising:
   a thermal fluid actuator that moves the thermal fluid through the thermal fluid passage.

5. The tester apparatus of claim 3, further comprising:
   a heater that is mounted in a position to heat the thermal fluid.

6. The tester apparatus of claim 5, wherein the heater is located in the thermal chuck.

7. The tester apparatus of claim 5, wherein the heater is located outside the thermal chuck.

8. The tester apparatus of claim 1, further comprising:
   a plurality of cartridges, each cartridge including:
      a cartridge body for holding a respective wafer;
      a plurality of cartridge contacts held by the cartridge body for making contact with contacts on the wafer;
      a cartridge interface connected to the cartridge contacts; and
      a plurality of first slot assembly interfaces, each first slot assembly interface being located on a respective one of the slot assemblies, each cartridge being insertable with a respective wafer into the frame and a respective cartridge interface connecting with a respective first slot assembly interface.

9. The tester apparatus of claim 8, further comprising:
   a plurality of tester interfaces; and
   a plurality of second slot assembly interfaces, each second slot assembly interface being located on a respective one of the slot assemblies, each slot assembly being insertable into the frame and a respective second slot assembly interface connecting with a respective tester interface.

10. A method of testing microelectronic devices comprising:
    placing a respective wafer of a plurality of wafers, each having at least one microelectronic device, in a respective cartridge body of a respective cartridge;
    placing each cartridge in a respective testing station provided by a respective thermal chuck of a respective slot assembly mounted to a frame;
    detecting a respective temperature indicative of a temperature of the respective wafer with a respective a temperature detector in proximity to the respective wafer;
    transferring of heat through a respective cartridge body between the respective thermal chuck and the respective wafer by changing a temperature of a respective temperature modification device held by a respective thermal chuck;
    controlling the transfer of heat based on the temperatures detected by the temperature detectors with a respective thermal controller forming part of a respective slot assembly based on the temperature of the wafer placed in the testing station of the respective slot assembly; and
    testing the microelectronic devices by providing at least power to each microelectronic device and measuring a performance of the microelectronic device.

11. The method of claim 10, wherein the temperature modification device is a heating element.

12. The method of claim 10, wherein the temperature modification device is a thermal fluid passage in the thermal chuck, further comprising:
    flowing a thermal fluid through the thermal fluid passage;
    moving thermal fluid through a thermal fluid passage in the thermal chuck to transfer heat between the thermal fluid and the thermal chuck.

13. The method of claim 12, further comprising:
    operating a thermal fluid actuator to move the thermal fluid.

14. The method of claim 12, further comprising:
    heating the thermal fluid with a heater.

15. The method of claim 14, wherein the heater is located in the thermal chuck.

16. The method of claim 14, wherein the heater is located outside the thermal chuck.

17. The method of claim 10, further comprising:

holding each of a plurality of wafers in a respective cartridge of a plurality of cartridges;

making contact between a plurality of cartridge contacts held by a cartridge body of the respective cartridge and contacts on the respective wafer;

inserting each cartridge with a respective wafer into the frame; and connecting a respective cartridge interface on each respective cartridge with a respective first slot assembly interface on the respective slot assembly.

18. The method of claim 17, further comprising:

inserting each slot assembly into the frame;

connecting a respective second slot assembly interface on each respective slot assembly with a respective tester interface.

19. A method of testing microelectronic devices comprising:

placing a respective wafer of a plurality of wafers, each having at least one microelectronic device, in a respective testing station provided by a respective holder of a respective slot assembly mounted to a frame;

detecting a respective temperature indicative of a temperature of the respective wafer with a respective a temperature detector in proximity to the respective wafer;

transferring of heat to or from the wafers;

controlling the transfer of heat based on the temperatures detected by the temperature detectors; and testing the microelectronic devices by providing at least power to each microelectronic device and measuring a performance of the microelectronic device, wherein a temperature of one of the wafers ramps up while a temperature of another one of the wafers ramps down.

* * * * *